United States Patent [19]
Yamazaki et al.

[11] Patent Number: 6,013,542
[45] Date of Patent: Jan. 11, 2000

[54] METHOD OF MANUFACTURING A SEMICONDUCTOR DEVICE

[75] Inventors: Shunpei Yamazaki, Tokyo; Jun Koyama, Kanagawa; Yasushi Ogata, Kanagawa; Satoshi Teramoto, Kanagawa, all of Japan

[73] Assignee: Semiconductor Energy Laboratory Co., Ltd., Kanagawa-ken, Japan

[21] Appl. No.: 08/717,940

[22] Filed: Sep. 23, 1996

[30] Foreign Application Priority Data

Sep. 21, 1995 [JP] Japan ................................ 7-267942

[51] Int. Cl.$^7$ .................................................. H01L 21/82
[52] U.S. Cl. ............................. 438/132; 438/30; 438/587
[58] Field of Search ............................. 438/30, 132, 467, 438/586–588, 592, 598–601, 637, 638, 669, FOR 355, FOR 433

[56] References Cited

U.S. PATENT DOCUMENTS

| | | | |
|---|---|---|---|
| 4,718,977 | 1/1988 | Contiero et al. | 438/669 |
| 4,740,485 | 4/1988 | Sharpe-Geisler | 438/132 |
| 5,219,793 | 6/1993 | Cooper et al. | 438/638 |
| 5,258,328 | 11/1993 | Sunada et al. | 438/669 |
| 5,397,719 | 3/1995 | Kim et al. | 438/30 |
| 5,422,293 | 6/1995 | Konya | 438/30 |
| 5,470,790 | 11/1995 | Myers et al. | 438/625 |
| 5,585,290 | 12/1996 | Yamamoto et al. | 438/30 |
| 5,663,094 | 9/1997 | Sakamoto | 438/637 |

FOREIGN PATENT DOCUMENTS

| | | | |
|---|---|---|---|
| 1-248536 | 10/1989 | Japan | 438/FOR 355 |
| 2-285658 | 11/1990 | Japan | 438/FOR 355 |
| 4-302166 | 10/1992 | Japan | 438/FOR 355 |
| 4-303925 | 10/1992 | Japan | 438/FOR 355 |

*Primary Examiner*—Charles Bowers
*Assistant Examiner*—Scott J. Hawranek
*Attorney, Agent, or Firm*—Fish & Richardson P.C.

[57] ABSTRACT

In a method of manufacturing a semiconductor device, a gate wiring and a source wiring of a thin film transistor in the course of manufacture are connected, and are finally divided, so that it is possible to prevent breakage of a gate insulating film due to influence of plasma at the formation of various insulating films or conductive films. Specifically, openings are formed at every formation of interlayer insulating films to first layer wirings to be finally divided, and dummy electrodes not serving as electrodes are formed in the openings. When patterning a final electrode, openings are further formed in the dummy electrodes, and the first layer wirings are divided through the openings.

19 Claims, 11 Drawing Sheets

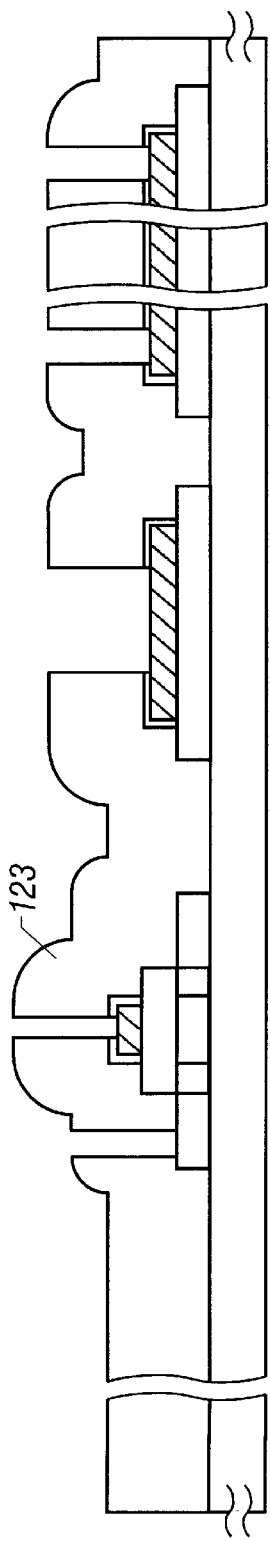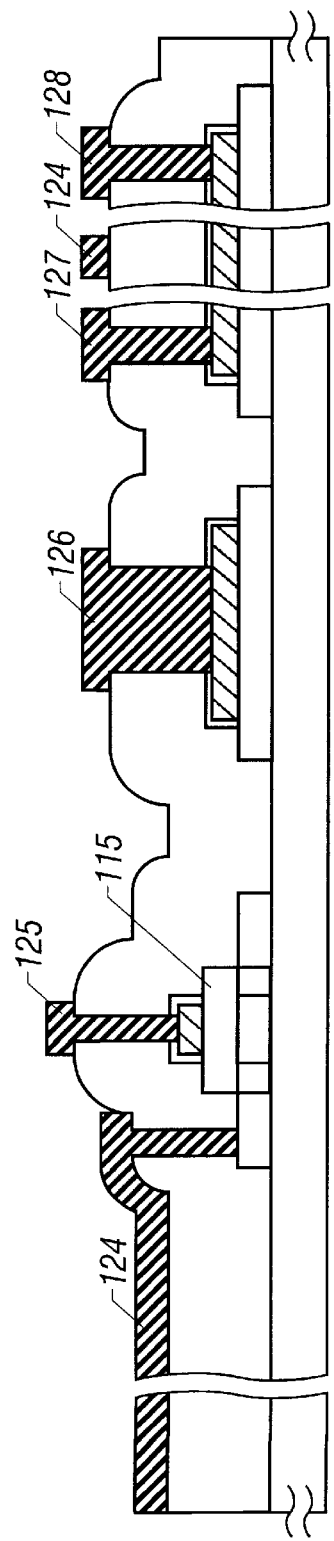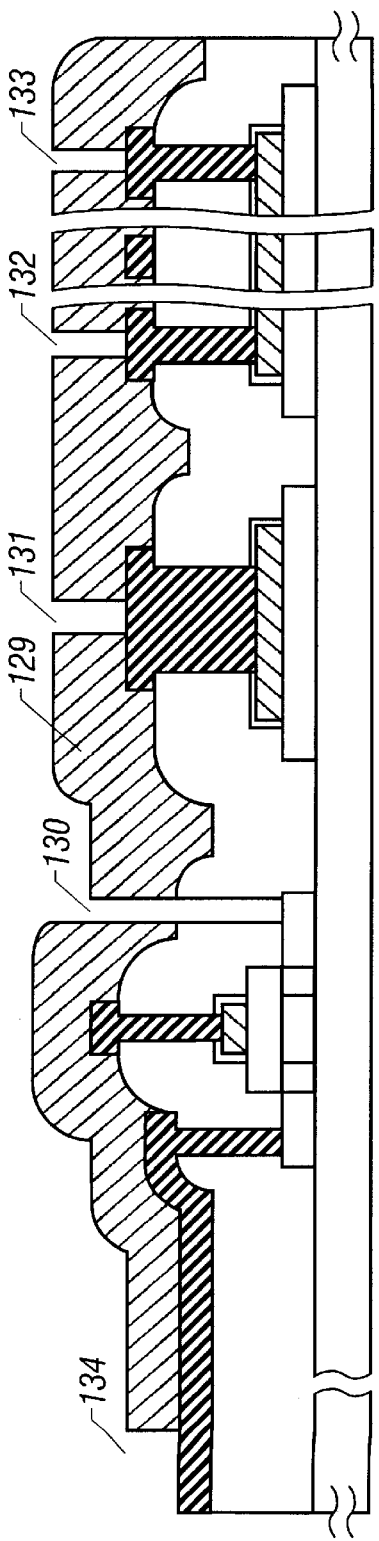
FIG. 2A
FIG. 2B
FIG. 2C

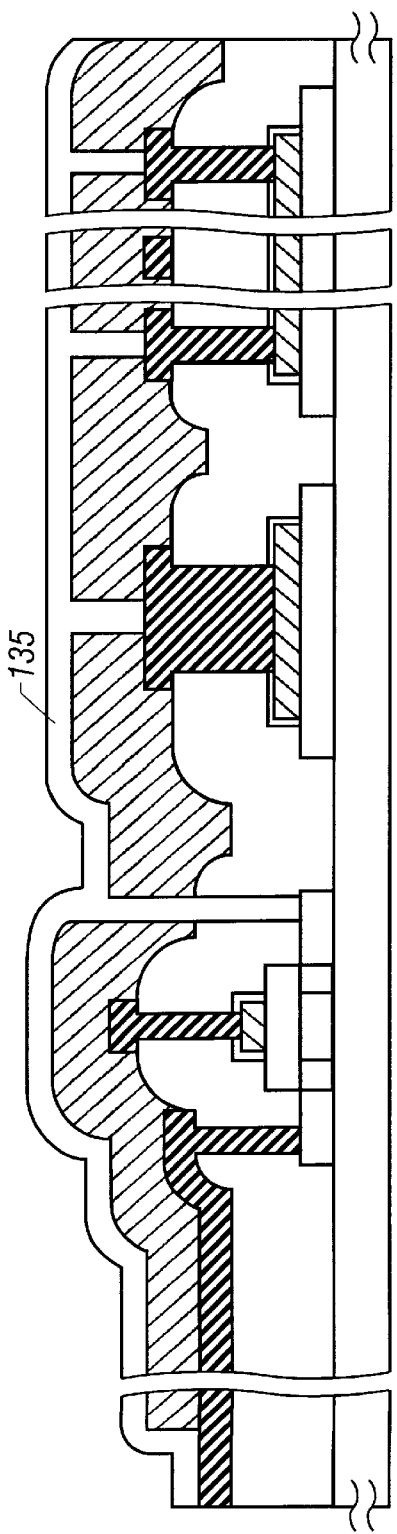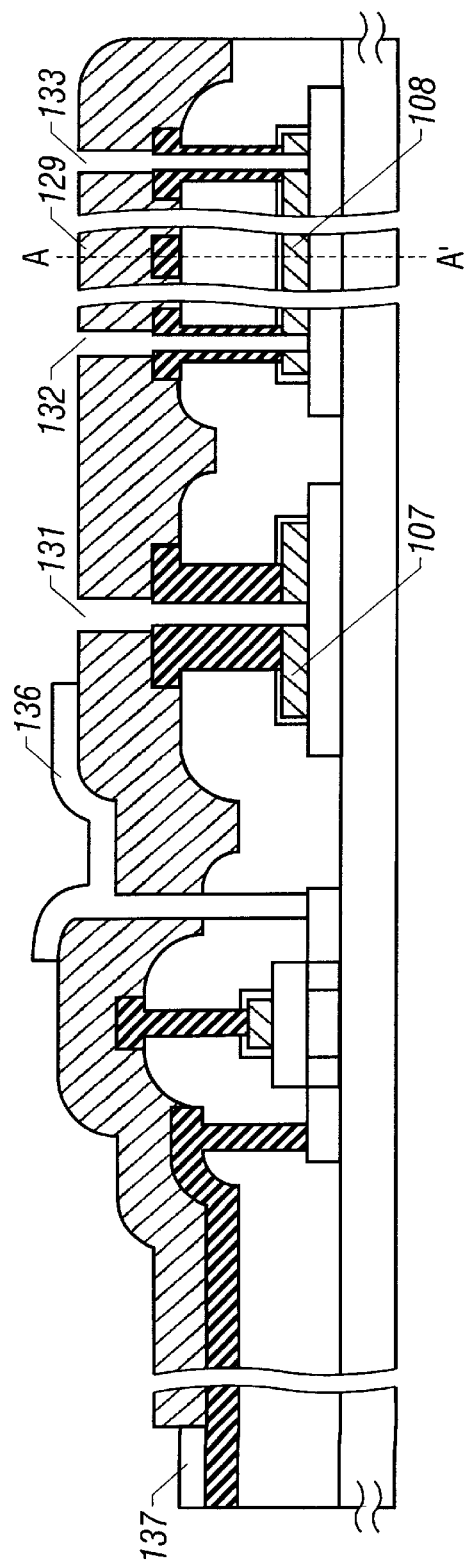
FIG. 3A
FIG. 3B

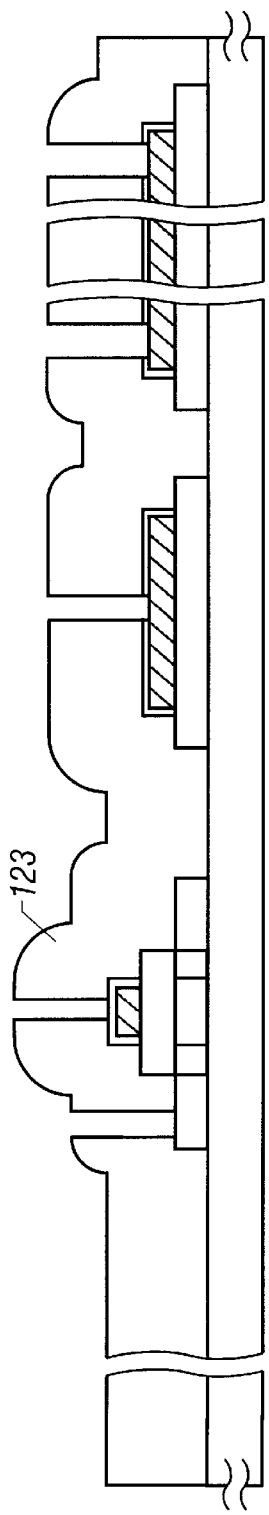
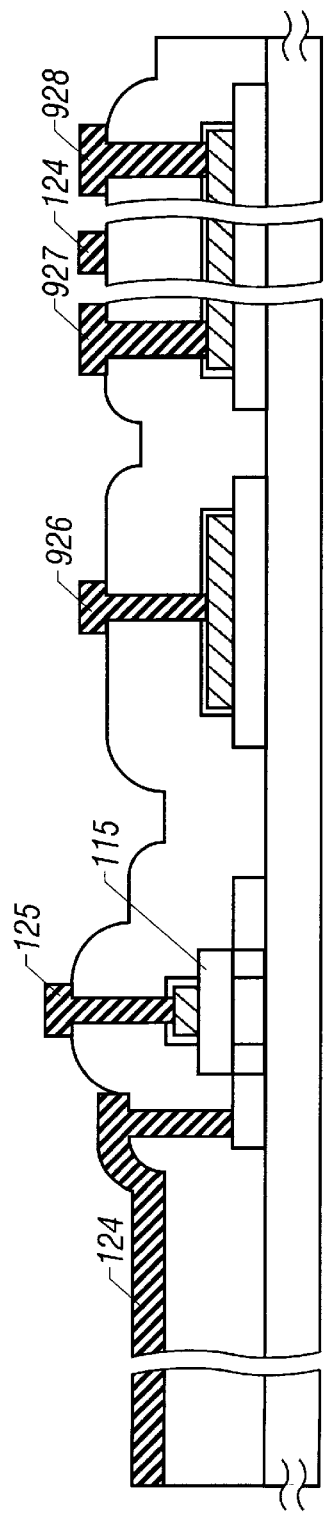
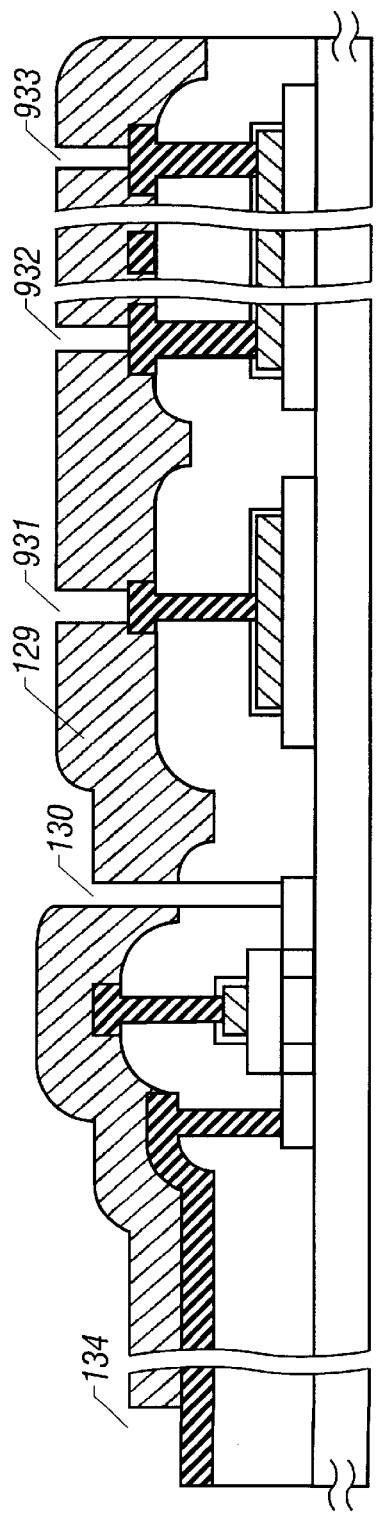
FIG. 9A
FIG. 9B
FIG. 9C

METHOD OF MANUFACTURING A SEMICONDUCTOR DEVICE

BACKGROUND OF THE INVENTION

1. Field of the Invention

The present invention relates to a method of producing an integrated thin film semiconductor device, and particularly, to a method of producing an active matrix type liquid crystal display device.

2. Description of the Related Art

An active matrix type liquid crystal display device has been conventionally known. This device comprises pixel electrodes arranged in a matrix form more than several hundred x several hundred on a glass substrate, and thin film transistors individually arranged for the respective pixel electrodes.

The thin film transistors arranged for the respective pixel electrodes serve to control electric charges flowing into and out of the respective pixel electrodes.

Further, there has been known a technique in which peripheral drive circuits for driving the thin film transistors arranged for the pixel electrodes are also formed of thin film transistor circuits. This structure is called a peripheral drive circuit integration type.

When such an active matrix type liquid crystal display device is manufactured, there is observed a phenomenon in which some of the thin film transistors integrated on the glass substrate do not work.

The present inventors made an extensive study to solve the above problem, and to obtain the following findings.

In case of manufacturing an integrated semiconductor device such as an active matrix type liquid crystal display device, insulating films and wirings are formed by using a plasma CVD method or a sputtering method, and plasma etching.

In the plasma CVD method or the sputtering method, and plasma etching, there are not a few ions having high energy (high energy ions).

On the other hand, an insulating film formed by using the plasma CVD method or the sputtering method has such a problem that the film quality is not dense, and the withstand voltage thereof is low. In general, the withstand voltage is less than about several tens V.

Here the situation as shown in FIG. 12 is examined. FIG. 12(B) is a sectional view showing a step for manufacturing a thin film transistor having a structure as shown in FIG. 12(A).

FIG. 12(B) shows the state in which a second interlayer insulating film 55 is formed. In general, the plasma CVD method or the sputtering method is used to form an interlayer insulating film. In this step, the above described high energy ions are inputted into a sample.

In general, a source electrode 54 and a gate electrode 51 are not conductive. Therefore, when high energy ions are partially inputted, there arises a state in which the source (S) electrode 54 and the gate (G) electrode 51 are charged at different potentials.

In such a situation, the potential difference between the source (S) electrode 54 and the gate (G) electrode 51 may instantaneously reach to several tens V to several hundred V.

The source electrode 54 and the gate electrode 51 are arranged through an active layer 52 and a gate insulating film 53.

As described above, the withstand voltage of the gate insulating film 53 formed by the CVD method or the sputtering method is less than several tens V. Therefore, according to the situation, the gate insulating film 53 may be electrically broken.

When the gate insulating film is broken, the thin film transistor does not work.

In the structure of the active matrix type display device in which several hundred x several hundred of thin film transistors are arranged, and further as a substrate an insulator such as glass or quartz is used, the above-mentioned phenomenon is particularly actualized.

To solve the above problem, during the film formation of the insulating film 55, the source electrode 54 and the gate electrode 51 may only be electrically shorted, so that both the electrodes have an equal potential. However, in the state in which a final operation is carried out, the source electrode 54 and the gate electrode 51 must not be electrically shorted.

Accordingly, in the step as shown in FIG. 12(B), the source electrode 54 and the gate electrode 51 are kept in the state being electrically shorted until the final stage, and the connection between the source electrode 54 and the gate electrode 51 is required to be cut at the final stage. However, this increases the number of steps, so that it is not preferable in view of production yields and production costs.

SUMMARY OF THE INVENTION

It is therefore an object of the present invention is to provide a technique to prevent the breakage of a semiconductor device in the course of production by pulse-like high potential given from plasma, and further to realize the technique without requiring complicated steps.

According to one aspect of the present invention, a method of manufacturing a semiconductor device comprises the steps of forming a first wiring, forming an insulating layer on the first wiring, forming a second wiring or an electrode on the insulating layer which contacts with the first wiring, and dividing the first wiring using a contact portion.

According to another aspect of the present invention, a method of manufacturing a semiconductor device comprises the steps of forming a first wiring, forming an insulating layer on the first wiring, forming a conductive material on the insulating layer which contacts with the first wiring, and dividing the first wiring through the contact portion (at a bottom portion of an opening).

According to further another aspect of the present invention, when multi-layer wirings are formed, a lower layer wiring is divided using patterning of an upper layer wiring or electrode.

According to still another aspect of the present invention, when multi-layer wirings are formed, a lower layer wiring is divided using the formation of openings to an upper layer wiring or electrode.

According to still further another aspect of the present invention, a method of manufacturing a semiconductor device comprises the steps of forming a gate electrode of a thin film transistor and a wiring made of a material which constitutes the gate electrode, forming an insulating film covering the gate electrode and the wiring, forming openings in the first insulating film to reach to a source region of the thin film transistor and a part of the wiring, forming an electrode and/or a wiring which contact with the source region, and a dummy electrode which contacts with a part of the wiring, forming a second insulating film covering the electrode and/or the wiring to be brought into contact with the source region, and the dummy electrode, forming an opening reaching to a drain region of the thin film transistor and an opening reaching the dummy electrode in the first insulating film and the second insulating film, and forming an electrode and/or wiring (pixel electrode) which contact with the drain region, and removing a part of the dummy electrode and the wiring.

In the above structure, the gate electrode and the drain electrode of the thin film transistor are electrically connected using the wiring. This structure can solve the problem of the breakage of the semiconductor device by pulse-like potential given from plasma during film formation or etching.

In the above structure, the wiring is divided at the final step. This dividing step can be performed without complicating the production steps.

Also, in the above structure, if the wiring is used as a wiring for supplying an electric current at anodic oxidation, dividing of this wiring after the anodic oxidation can be performed without providing a specific step.

According to still another aspect of the present invention, a method of manufacturing a semiconductor device comprises the steps of forming a first wiring on an insulated surface, forming a first insulating film on the wiring, forming an opening in the first insulating film at a portion where the first wiring is to be divided, forming a metal portion in the opening which contacts with the first wiring, forming a second insulating film covering the metal portion, forming an opening in the second insulating film to expose the metal portion, forming a conductive film which forms an electrode on the second insulating film, and removing the metal portion and the first wiring under the metal portion when patterning the conductive film.

According to still further another aspect of the present invention, a method of manufacturing a semiconductor device comprises the steps of forming a gate electrode and a gate wiring, and a wiring made of the same material which constitutes the gate electrode and the gate wiring, forming a first insulating film subsequent to the above step, forming an opening in the first insulating film to form a metal portion which contacts with the wiring, forming a second insulating film covering the metal portion, forming an opening reaching to the metal portion in the second insulating film, forming a pixel electrode on the second insulating film, and removing the metal portion through the opening when patterning the pixel electrode, and removing the wiring under the metal portion to divide the wiring.

Here, the removal of the wiring must be carried out so as to completely divide the wiring.

According to the present invention described above, the gate wiring and the source wiring of the thin film transistor are connected, and finally cut (divided), so that it is possible to prevent breakage of the gate insulating film due to influence of plasma when forming various insulating films or conductive films. That is, it is possible to prevent breakage of the gate insulating film due to a potential difference when the gate wiring and the source wiring become to have different potentials instantaneously by the influence of plasma.

When the following technique is adopted to connect the gate wiring and the source wiring and finally to divide them, the above operation and effects can be obtained without increasing masks and special complicated structure.

That is, as shown in FIGS. 1 to 3, openings are formed at every formation of interlayer insulating film in the finally divided wirings 107 and 108 (first layer wiring), and dummy electrodes 126 to 128 which do not function as electrodes are formed. Then, when patterning a final electrode 136, shown in FIGS. 3(A) and 3(B), openings are formed in the dummy electrodes 126 to 128, and the wirings 107 and 108 are divided through the openings.

With the above structure, when patterning the electrode 136, predetermined portions of the wirings 107 and 108 can be divided at the same time.

Also, this step is a very useful technique to divide a wiring for a power supply which is used when the anodic oxidation is carried out. In other words, without using a specific mask, it is possible to divide the wiring for supplying an electric current.

BRIEF DESCRIPTION OF THE DRAWINGS

FIGS. 2(A) to 2(C) are views showing manufacturing steps of an active matrix type liquid crystal display device;

FIGS. 3(A) to 3(B) are views showing manufacturing steps of an active matrix type liquid crystal display device;

FIGS. 9(A) to 9(C) are views showing manufacturing steps of an active matrix type liquid crystal display device;

DETAILED DESCRIPTION OF THE INVENTION

[Embodiment 1]

This embodiment show the manufacturing steps of pixel regions of an active matrix type liquid-crystal display device. In this embodiment, in order to achieve low OFF-current characteristics, a thin film transistor with a low concentration impurity region is arranged for the individual pixel regions.

FIGS. 1 to 4 schematically show the manufacturing steps of this embodiment. First, as shown in FIG. 1(A), a base film (not shown) with a thickness of 3000 Å is formed on a glass substrate 101 by a plasma CVD method or a sputtering method. Here, a silicon oxide film is used as the base film. It should be noted that a quartz substrate may be used as the substrate 101.

Next, an amorphous silicon film (not shown) with a thickness of 500 Å, which is a starting film to form an active layer 102 of the thin film transistor, is formed by the plasma CVD method or a low pressure thermal CVD method. Next, the amorphous silicon film is crystallized by heating and/or irradiation with laser light to obtain a crystalline silicon film (not shown).

Here, this embodiment shows a technique in which the amorphous silicon film formed by the CVD method is crystallized by annealing through heating or irradiation with laser light. However, a crystalline silicon film may be directly formed by the low pressure thermal CVD method or the plasma CVD method.

Figure 1A:
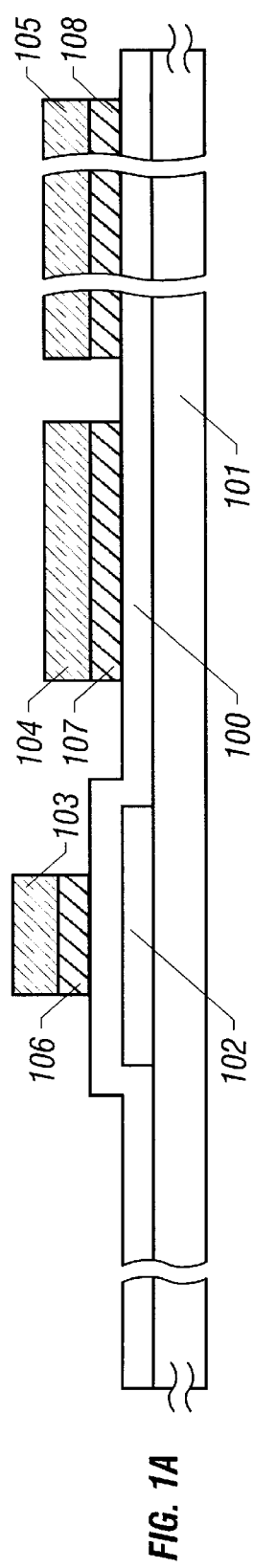
FIGS. 1(A) to 1(D) are views showing manufacturing steps of an active matrix type liquid crystal display device.

The crystalline silicon film crystallized in the above step is patterned to obtain an active layer 102 of the thin film transistor as shown in FIG. 1(A). Here, a first mask for patterning is used.

Next, a silicon oxide film 100 with a thickness of 1000 Å serving as a gate insulating film is formed by the plasma CVD method.

An aluminum film (not shown) for making a first layer wiring is further formed by the sputtering method or an electron beam evaporation method. Patterns designated by reference numerals 106, 107 and 108 in FIG. 1(A) are formed later so that the first layer wiring is completed.

In this aluminum film, in order to suppress the generation of hillocks or whiskers, Sc or Y, and one or plural kinds of elements selected from lanthanoid and actinoid may be added. Here, Sc of 0.1 wt. % is added.

It should be noted that the hillocks or the whiskers are needlelike or spike-like protrusions formed on the surface of the aluminum film when it is heated up to a temperature 300° C. or more, or it is irradiated with laser light.

After the aluminum film (not shown) is formed, a very thin anodic oxidation film (not shown) is formed thereon. The anodic oxidation film has a function to improve the degree of close adhesion of resist masks (designated by 103 to 105) to be arranged on the aluminum film in a later step.

The above very thin anodic oxidation film is formed by using an electrolytic solution formed by neutralizing an ethylene glycol solution containing 3% by weight of tartaric acid with ammonia water. The anodic oxidation is carried out in the electrolytic solution using the aluminum film as an anode and a platinum as a cathode.

Here, the anodic oxidation film formed here has a dense film quality. The film thickness can be controlled by an applied voltage. Here., the thickness thereof is 150 Å.

Next, the resist masks 103, 104 and 105 are disposed on the aluminum film. Since the dense anodic oxidation film (not shown) is formed on the aluminum film, the resist films can be brought into close contact with the aluminum film without gaps. A second mask is used in formation of the resist masks.

Next, patterning is carried out using the resist masks 103, 104 and 105 to form a gate electrode 106, a gate wiring (not shown) extending from the gate electrode, a part 107 of a short circuit wiring to connect the gate wiring and a source wiring at a later step, and a part 108 of a wiring used to supply an electric current when the anodic oxidation to the gate electrode is carried out at a later step. In this way, the state as shown in FIG. 1(A) is obtained.

Figure 1B:
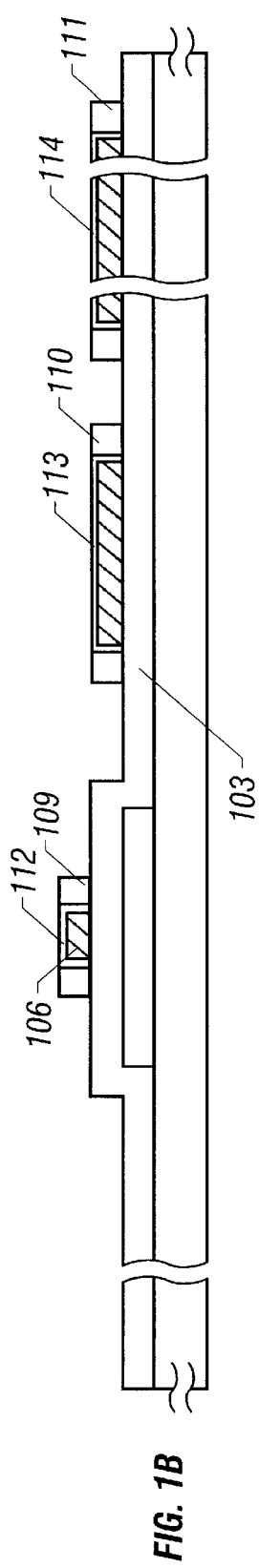

Next, in the state where the resist masks are disposed, as shown in FIG. 1(B), porous anodic oxidation films 109, 110 and 111 are formed.

The porous anodic oxidation films are formed by using as an electrolytic solution of 3% of oxalic acid. Specifically, the anodic oxidation is carried out in the above described solution using the first layer wirings (patterns designated by 106 to 108) formed at the step of FIG. 1(A) as an anode and platinum as a cathode, and making a current flow between both the electrodes.

At that time, since the resist masks are disposed on the upper portion of the respective patterns of aluminum, the electrolytic solution is not brought into contact with the upper surfaces of the aluminum patterns. Thus, the anodic oxidation progresses at only side surfaces of the respective aluminum patterns.

The anodic oxidation is carried out by supplying an electric current through the wiring for supplying an electric current (a part thereof is designated by 108).

The wiring for supplying an electric current is used to prevent the film thickness of an anodic oxidation film from becoming different by a voltage drop generated between both ends of the active matrix region at the anodic oxidation. Especially, when the area of the liquid-crystal panel is made large, it is necessary to use the wiring for supplying an electric current.

The growth distance of the porous anodic oxidation film can be controlled by an anodic oxidation time. The growth distance of the porous anodic oxidation film can be selected between about 3000 Å to 10000 Å. Here, the film thickness (growth distance) of the porous anodic oxidation film is 5000 Å. It should be noted that the growth distance of the porous anodic oxidation film can roughly determine the size of a low concentration impurity region to be formed at a later step.

The porous anodic oxidation film serves to form the low concentration impurity region (region generally referred to as an LDD region) and to suppress the occurrence of defects at a two-level crossing portion between the first layer wiring and the second layer wiring.

After forming the porous anodic oxidation films designated by 109, 110 and 111 in FIG. 1(B), the resist masks 103, 104 and 105 (not shown in FIG. 1(B)) are removed.

Next, anodic oxidation films having the dense film quality are again formed. Here, the anodic oxidation films 112, 113 and 114 are formed. The dense anodic oxidation films have very great effects to suppress the generation of the hillocks or the whiskers.

The formation of the dense anodic oxidation film is carried out by using an electrolytic solution formed by neutralizing an ethylene glycol solution containing 3% by weight of tartaric acid with ammonia water.

In this step, since the electrolytic solution intrudes into the porous anodic oxidation films 109, 110 and 111, the dense anodic oxidation films are formed on the upper surfaces and side surfaces of the electrode and the wirings (designated by 106 to 108) made of remaining aluminum as designated by 112, 113 and 114.

Also in this anodic oxidation, using the wiring for supplying an electric current for anodic oxidation, a portion of which is designated by 108, an electric current at the anodic oxidation is supplied. This is adopted to correct the influence of a voltage drop so that the film thickness of the formed anodic oxidation films is made uniform as a whole.

The thickness of the dense anodic oxidation film is made 800 Å. If the thickness of the dense anodic oxidation film is made thick (for example, 2000 Å or more), an offset gate region can be formed in the active layer by the thick portion afterward. However, when the dense anodic oxidation film is formed thick, an applied voltage must be high (a voltage of 200 V or more is required to obtain a film thickness of 2000 Å or more), so that it is not preferable in view of the reproducibility of operation and the safety. Thus, here, in order to obtain such effects to suppress the generation of the hillocks and the whiskers, and to improve the withstand voltage, the thickness of the dense anodic oxidation film is made 800 Å.

In this step, the gate electrode and the gate wiring 106 as shown in FIG. 1(B) are formed. The sectional size of the gate electrode and the gate wiring 106 is decreased by the anodic oxidation as compared with the shape designated by 106 in FIG. 1(A).

The dense anodic oxidation films 113 and 114 and the porous anodic oxidation films 110 and 111 are formed around the part 107 of the short circuit wiring to connect the gate wiring to the source wiring, and also around the part 108 of the wiring for supplying an electric current to the gate electrode at the anodic oxidation. Accordingly, the sectional size of these wiring are decreased by the anodic oxidation.

Figure 1C:
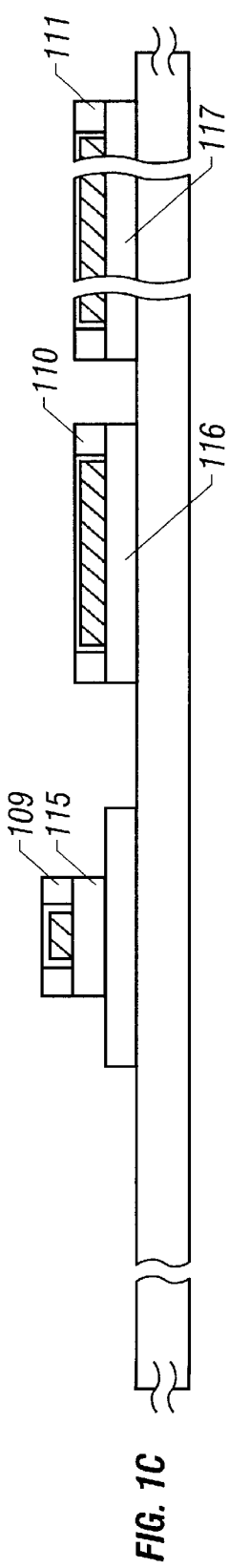

In this way, the state as shown in FIG. 1(B) is obtained. Next, the exposed silicon oxide film 103 is removed. The exposed silicon oxide film 103 is removed to form a low concentration impurity region in the active layer 102 of the thin film transistor. In this way, the state as shown in FIG. 1(C) is obtained. In this state, the silicon oxide films remain at portions designated by 115, 116 and 117.

Next, the porous anodic oxidation films 109, 110 and 111 are removed. The porous anodic oxidation film can be selectively removed by using a mixed acid of phosphoric acid, acetic acid and nitric acid.

Figure 1D:
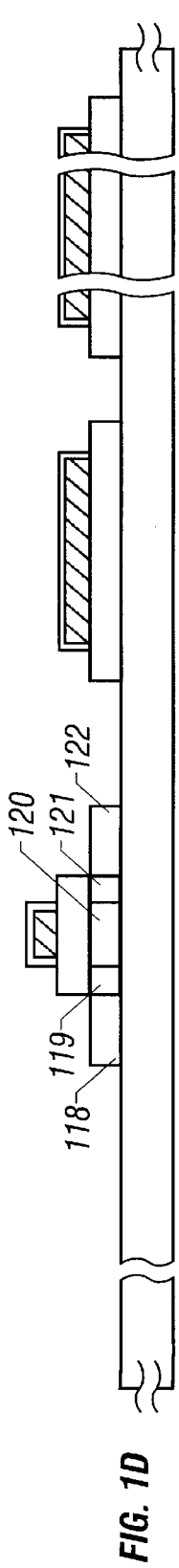

In this way, the state as shown in FIG. 1(D) is obtained. After the state as shown in FIG. 1(D) is obtained, impurity ions are implanted in order to obtain a source region and a drain region of the thin film transistor. Here, P ions are implanted to form an N-channel type. B ions may be implanted to form a P-channel type thin film transistor other than the N-channel type.

In this step, a source region 118 and a drain region 122 are formed in a self alignment manner. Also, low concentration impurity regions designated by 119 and 121 are formed in a self alignment manner. The low concentration impurity region 121 formed between a channel formation region 120 and the drain region 122 is a so-called LDD (lightly doped drain) region (FIG. 1(D)).

The low concentration impurity regions become a very useful structure to obtain a thin film transistor having low OFF-current characteristics. Especially, since the thin film transistor arranged for a pixel of the active matrix region is required of the low OFF-current characteristics, it is useful to provide the low concentration impurity regions to make the low OFF-current characteristics.

The low concentration impurity regions also have a function to prevent the deterioration of characteristics of the thin film transistor.

After the impurity ion implantation, irradiation of laser light is carried out to activate the implanted impurity ions and to anneal the region damaged by the ion implantation. At this time, the generation of the hillocks and the whiskers at the gate electrode 106 and the wirings 107 and 108 can be prevented by the operation of the previously formed anodic oxidation films 112, 113 and 114 having the dense film quality.

Next, a silicon oxide film with a thickness of 4000 Å serving as a first interlayer insulating film 123 is formed by a plasma CVD method using TEOS gas as a raw material of (FIG. 2(A)).

As the interlayer insulating film 123, a silicon nitride film or a silicon nitride oxide film may be used. The silicon nitride film may be formed by the plasma CVD method using ammonia as a raw material gas. The silicon nitride oxide film may be formed by the plasma CVD method using the TEOS and $N_2O$ gas.

Also, as the first interlayer insulating film 123, a laminated structure in which plural kinds of films selected from the silicon oxide film, silicon nitride film, and silicon nitride oxide film are laminated, may be used.

After the first interlayer insulating film 123 is formed, contact holes are formed. In this step, a third mask is used. In this way, the state as shown in FIG. 2(A) is obtained.

Then, a second layer electrode and wiring (generally referred to as second layer wiring) made of three-layer film of a titanium film. an aluminum film and a titanium film is formed. Since the titanium film is merely used to obtain good contact, the thickness thereof may be less than several hundred A. In this step, a fourth mask is used (FIG. 2(B)).

As the second layer wiring, merely a single layer film of an aluminum film may be used. However, in order to make good contact with other electrodes or wirings, the three-layer structure comprising the titanium film, aluminum film, and titanium film is used in this embodiment.

Different etchants are respectively used for etching the titanium film and the aluminum film. In this embodiment, an ammonium water is used for etching the titanium film, and an aluminum mixed acid is used for etching the aluminum film.

In this way, the state as shown in FIG. 2(B) is obtained. The source electrode and the source wiring are designated by 124 in FIG. 2(B). The wiring designated by 124 is a second layer wiring.

Also, in this step, dummy electrodes 126, 127 and 128, which are used at a later dividing step, are formed.

Although not clear from the drawing, the source wiring 124 as the second layer wiring is connected to the gate electrode 106 through the short circuit wiring designated by 107. With this structure, it is possible to eliminate the potential difference between the source wiring 124 and the gate electrode 106.

Further, the source wiring 124 is arranged to cross over the wiring 108 for current supply at the anodic oxidation through the first interlayer insulating film 123.

Further, FIG. 2(B) shows the dummy electrodes (referred to as electrodes for convenience) 126, 127 and 128 which do not function as electrodes or wiring but are used for a later dividing step. The dummy electrodes function at the final step where the wiring 107 and 108 are divided (FIG. 2(B)).

Next, a second interlayer insulating film 129 is formed. In this embodiment, as the second interlayer film 129, a silicon oxide film with a thickness of 4000 Å is formed by the plasma CVD method. As the second interlayer insulating film 129, a silicon nitride film, a silicon oxide nitride film, or a laminated film of these insulating films and a silicon oxide film may be used.

In the film formation of the second interlayer insulating film, the source wiring 124 is shorted to the gate electrode 106 through the short circuit wiring 107. Therefore, it is possible to avoid the occurrence of potential difference between the source wiring 124 and the gate electrode 106 by the influence of plasma. Then, it is possible to prevent the gate insulating film (silicon oxide film) 115 from being broken by the potential difference occurring between the source wiring 124 and the gate electrode 106.

Next, contact holes denoted by reference numerals 130, 131, 132 and 133 are formed. At this time, a fifth mask is used. In this way, the state as shown in FIG. 2(C) is obtained. Here, reference numeral 130 denotes a contact hole to the drain region, 131 designates an opening used for dividing the wiring 107, and 132 and 133 designate openings used for dividing the wiring 108.

Further in this step, the surface of an end portion 134 of the source electrode and the source wiring 124 is exposed. The portion becomes an external lead-out terminal afterward. It should be noted that the source wiring is actually connected to a peripheral drive circuit for driving an active matrix circuit, and the external terminal of the peripheral circuit becomes the portion 134. In FIG. 2, the peripheral drive circuit is not shown for avoiding complication.

Next, as shown in FIG. 3(A), an ITO electrode 135 for forming a pixel electrode is formed by the sputtering method. The ITO electrode 135 is patterned to form a pixel electrode 136. At this time, a sixth mask is used (FIG. 3(B)).

In the formation of the pixel electrode 136, after removing the ITO electrode 135 which becomes unnecessary, etching of electrodes (dummy electrodes) designated by 126, 127 and 128 of the second layer wiring is further made to progress. Further, a part of the first wiring designated by 107 and 108 are also removed by etching.

In other words, at the opening portions designated by 131, 132 and 133, the second layer wiring and the first layer wiring are simultaneously removed. As a result, the wiring 107 and 108 are divided (cut) at the opening portions designated by 131, 132 and 133.

At this time, since the second layer wiring is the laminated layer film of a titanium film and an aluminum film, it is necessary to perform etching by changing an etchant for each film.

In this way, the state as shown in FIG. 3(B) is obtained. Since this step is carried out at the same time as the patterning of forming the pixel electrode, it is possible to omit the use of a new mask. That is, it is possible to avoid the complication of production steps.

The reason why the first layer wiring and the second layer wiring can be simultaneously removed, is that only metal material can be selectively removed for the insulating film such as a silicon oxide film.

Also, at the same time with this step, an ITO film 137 is made remain at the surface of the lead-out portion 134 of a liquid-crystal panel extending from the source wiring 124. The ITO film serves as a buffer layer to prevent corrosion or mutual diffusion between a metal wiring or a conductive pad to be brought into contact with the lead-out electrode portion and a contact portion.

Also, it becomes important that the wiring for supplying an electric current 108 at the anodic oxidation is cut at the portions 132 and 133.

In assembling of a liquid-crystal panel at a later step, a resin film for rubbing is formed covering the second interlayer insulating film, and rubbing for orientating the liquid-crystal is performed. At this time, the wiring 108 is electrically floating. In this state, there is a fear that a harmful influence is caused by static electricity generating at the rubbing.

However, as shown in this embodiment, since the wiring 108 is divided at the portions 132 and 133, it is possible to suppress the influence of the static electricity.

It should be noted that, in the drawings, although divided portions of the wiring 107 and the wiring 108 are one and two portions, respectively, the divided portions may be suitably set.

Figure 5:
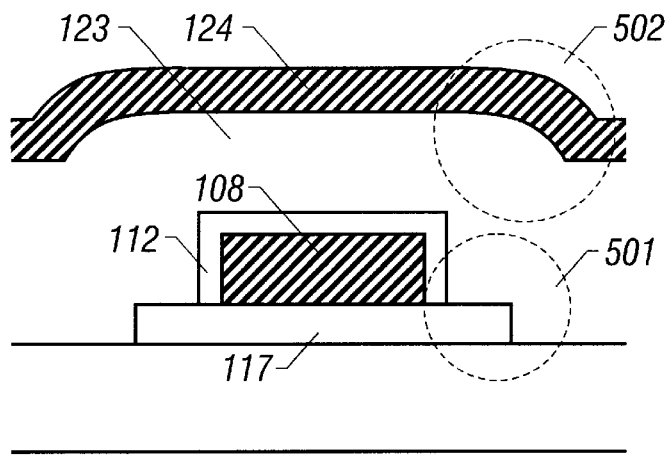
FIG. 5 is a sectional view taken along line A to A' in FIG. 3(B)

FIG. 5 is a view showing a cross-section taken along A to A' of FIG. 3(B). As shown in FIGS. 6A and 6B, the source wiring 124 rides over the wiring 108 for supplying an electric current at the anodic oxidation to form the state of three-dimensional wiring. At this time, a portion denoted by reference numeral 501 of the wiring 108 has a stair-like shape due to formation of the porous anodic oxidation film.

Therefore, it is possible to smooth the surface of a portion 502 of the first interlayer insulating film 123. As a result, it is possible to prevent the source wiring 124 from being cut at the portion 502.

Figure 4:
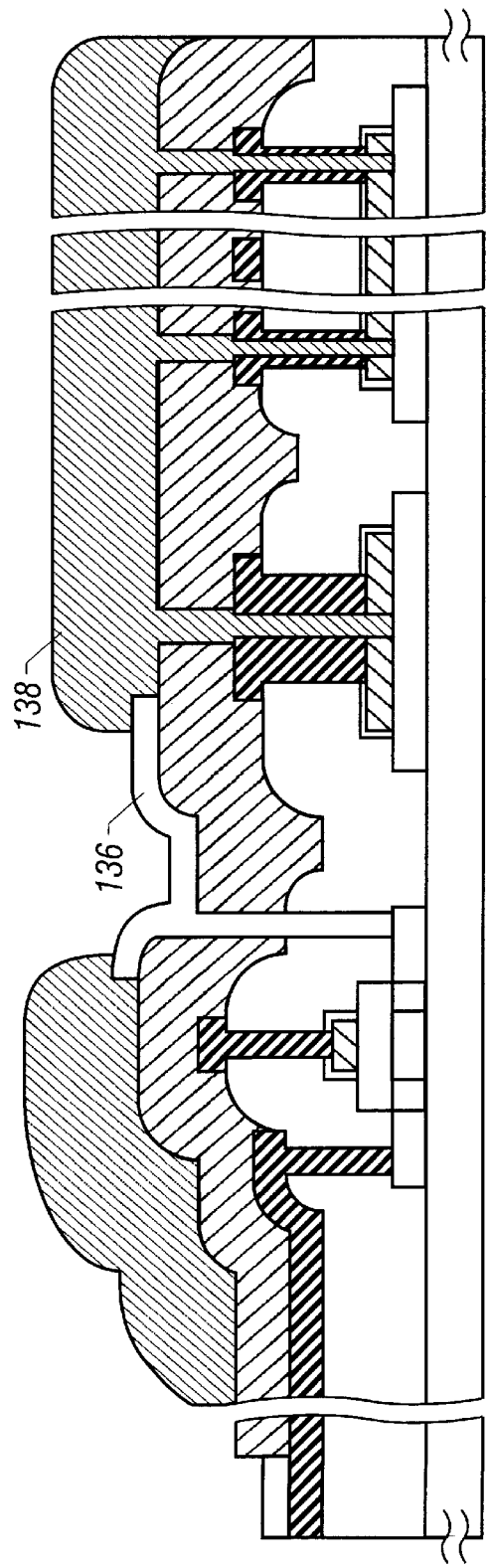
FIG. 4 is a view showing a manufacturing step of an active matrix type liquid crystal display device.

After obtaining the state shown in FIG. 3(B), coating of a resin material forming a BM (black matrix) structure is performed. The resin material is patterned using a seventh mask. In this way, one substrate constituting a liquid-crystal panel covered with a BM 138 except the pixel electrode 136 is completed (FIG. 4).

In the formation of the BM 138, the holes designated by 131, 132 and 133 are filled with materials forming the BM. Since the material forming the BM is a resin material, filling the respective openings with the material forming the BM is effective in order to obtain high reliability.

In this embodiment, etching is carried out as wet etching. However, dry etching may be used.

[Embodiment 2]

Figure 6:
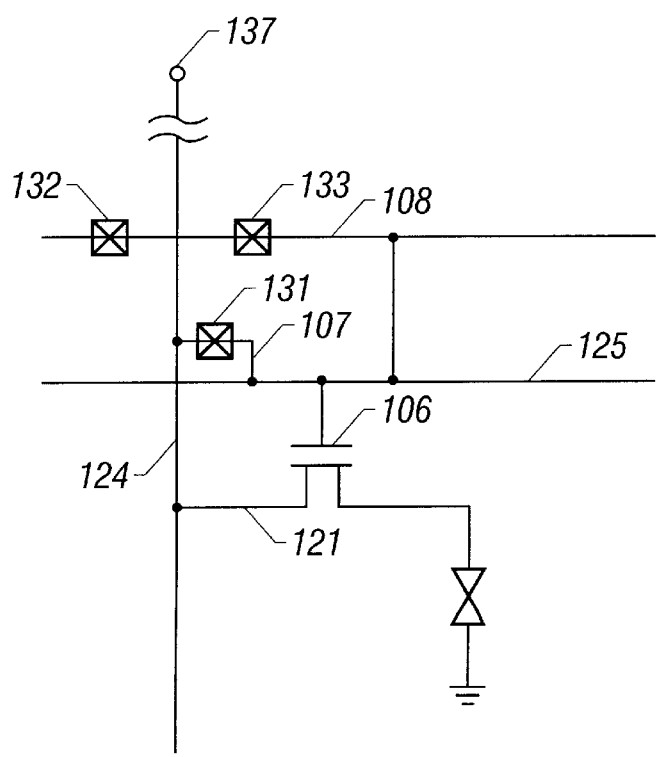
FIGS. 6A and 6B are top views showing an active matrix type circuit.

In this embodiment, there is shown an example of state in which the structure shown in FIGS. 1 to 4 is seen from the top surface. FIG. 6 shows a part of an active matrix circuit of an active matrix type liquid crystal panel. FIGS. 6A and 6B does not indicate a peripheral drive circuit for applying a drive signal to a source wiring and a gate wiring.

In the structure as shown in FIGS. 6A and 6B, the gate wiring 125 is shorted to the source wiring 124 through the short circuit wiring 107. This short circuit wiring is divided at the opening 131 in the step shown in FIG. 3(B).

The line 108 for supplying an electric current to be used at the anodic oxidation, is divided at the openings 132 and 133 in the step shown in FIG. 3(B). The source wiring 124 crosses over the divided portions through the interlayer insulating film 123.

[Embodiment 3]

This embodiment relates to the shape of the first wiring divided at the openings 132 and 133 shown in FIG. 3(B). For example, the wiring designated by 108 becomes unnecessary after completion of the anodic oxidation. However, there is a fear that a pulse current due to the abnormality of local discharge flows through the wiring 108 which is extended long at the film formation of the first interlayer insulating film 123 and the second interlayer insulating film 129.

At the film formation of the first interlayer insulating film 123 or the second interlayer insulating film 129, the wiring 108 is connected to the respective gate electrodes. Therefore, when a pulse current flows through the wiring 108, a pulse voltage is applied to the respective gate electrodes.

Figure 7A:
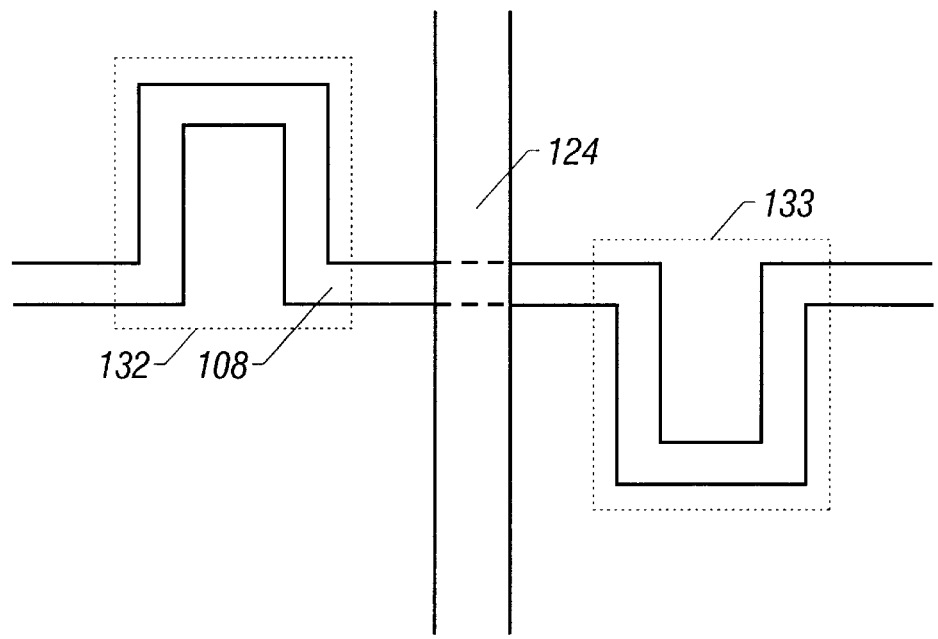
FIGS. 7(A) to 7(B) are views showing an example of the shape of wiring.
Figure 7B:
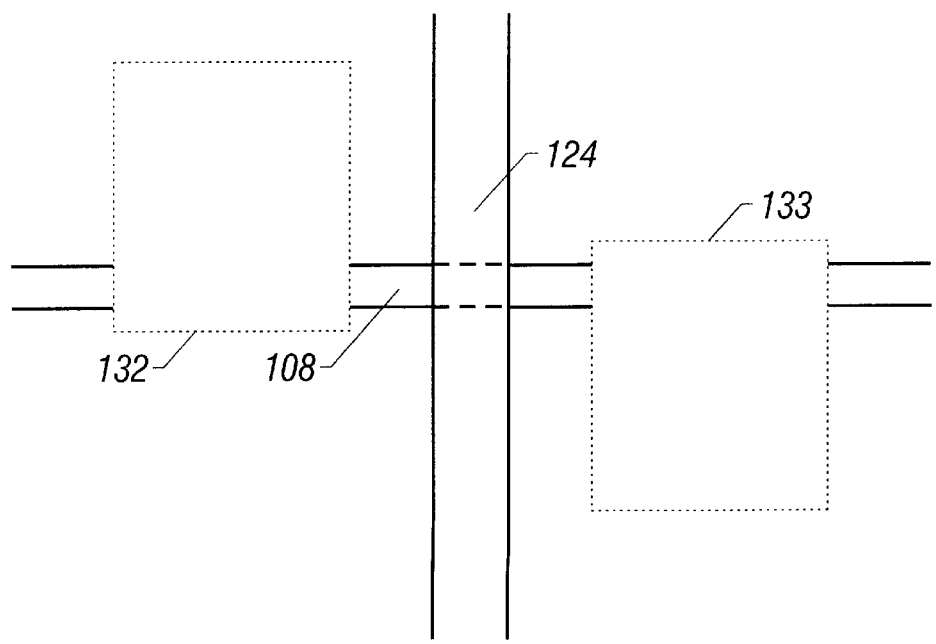
Figure 8A:
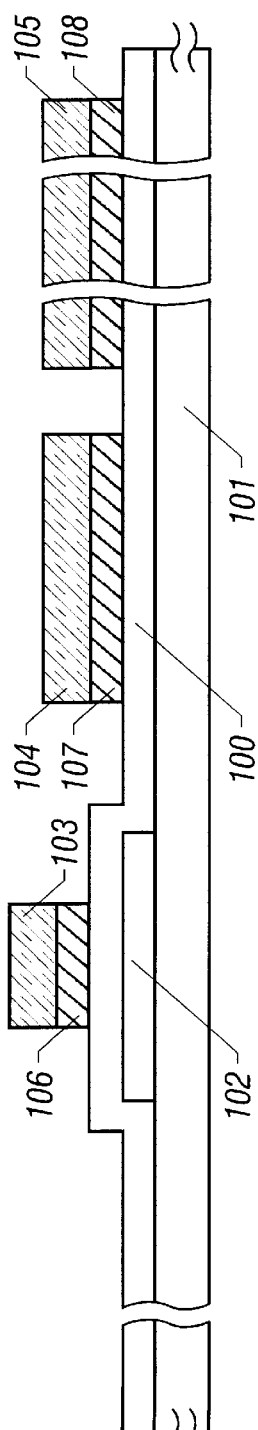
FIGS. 8(A) to 8(D) are views showing manufacturing steps of an active matrix type liquid crystal display device.
Figure 8B:
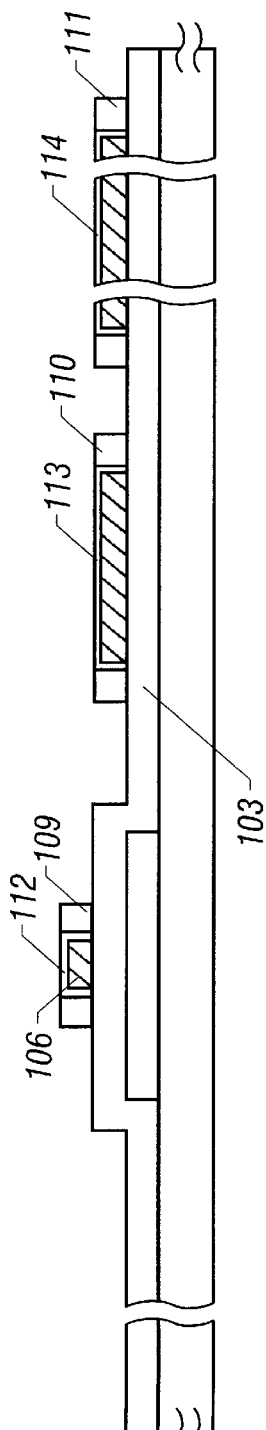
Figure 8C:
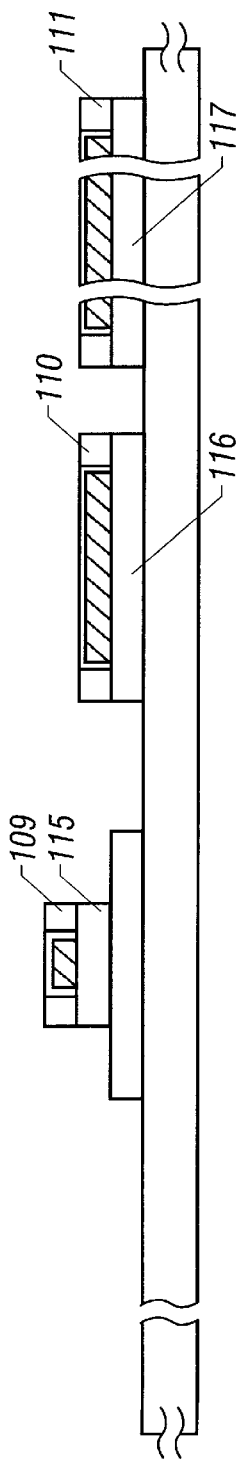
Figure 8D:
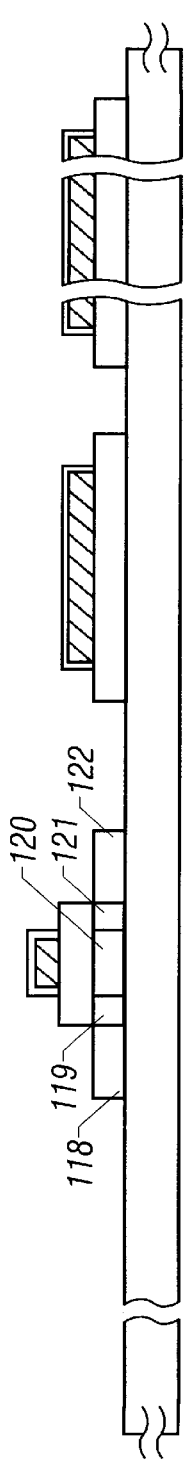

In the structure indicative of this embodiment, as shown in FIG. 7, the wiring 108 is formed into a U-shape at the divided portion. The pulse current is extinguished or attenuated at this portion. That is, this embodiment is characterized in that the divided portion is formed into such a shape that a pulse current is easily discharged. FIG. 7(A) shows the state before division, and FIG. 7(B) shows the state after division.

The U-shaped wiring portions are removed at the opening portions 132 and 133 (opening portions shown in FIG. 3(B)).

[Embodiment 4]

Figure 10A:
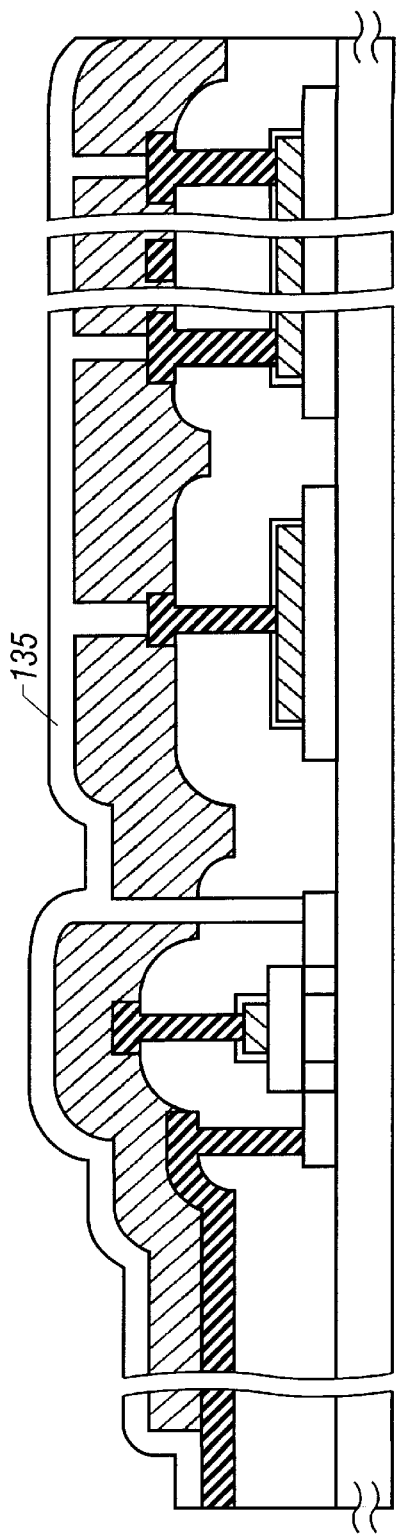
FIGS. 10(A) to 10(B) are views showing manufacturing steps of an active matrix type liquid crystal display device.
Figure 10B:
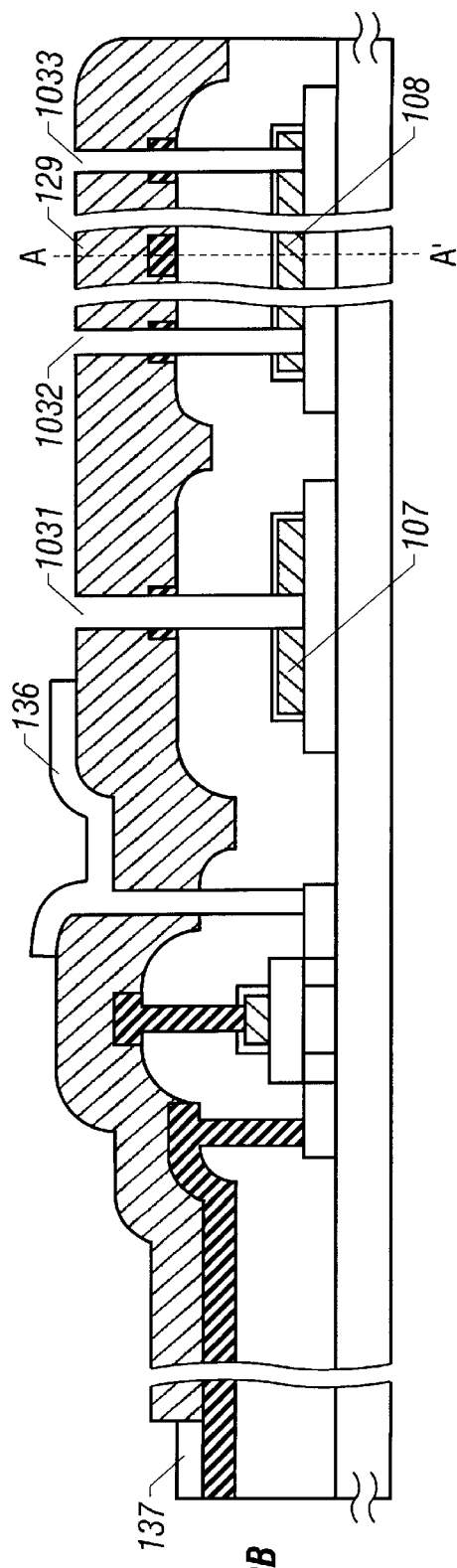
Figure 11:
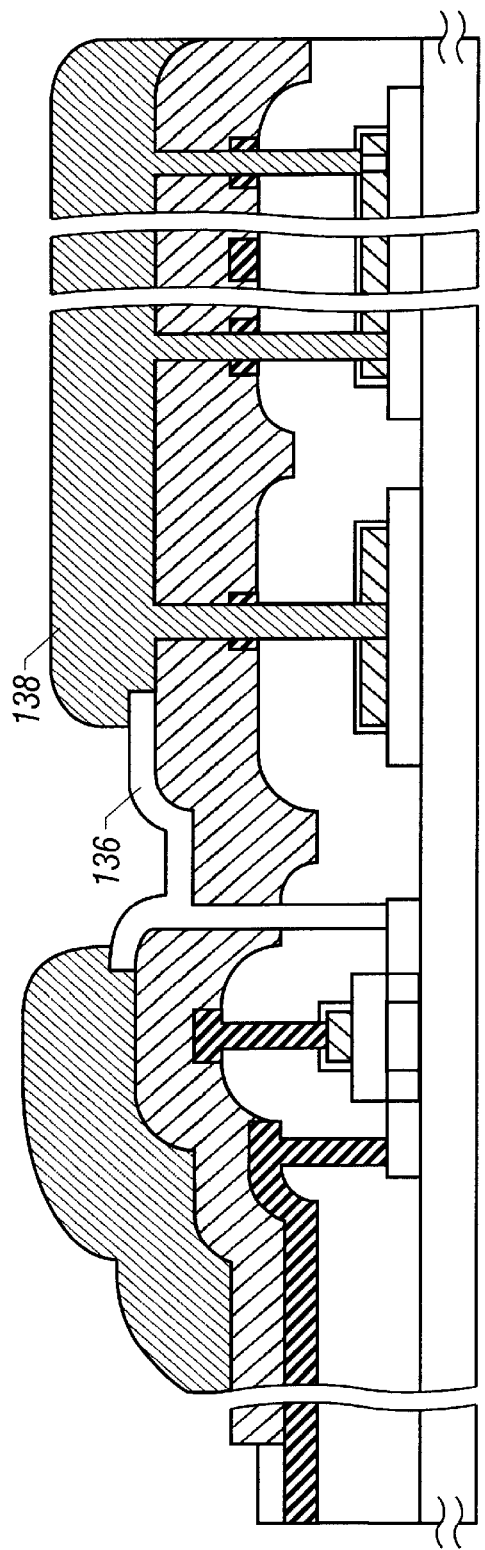
FIG. 11 is a view showing a production step of an active matrix type liquid crystal display device.
Figure 12A:
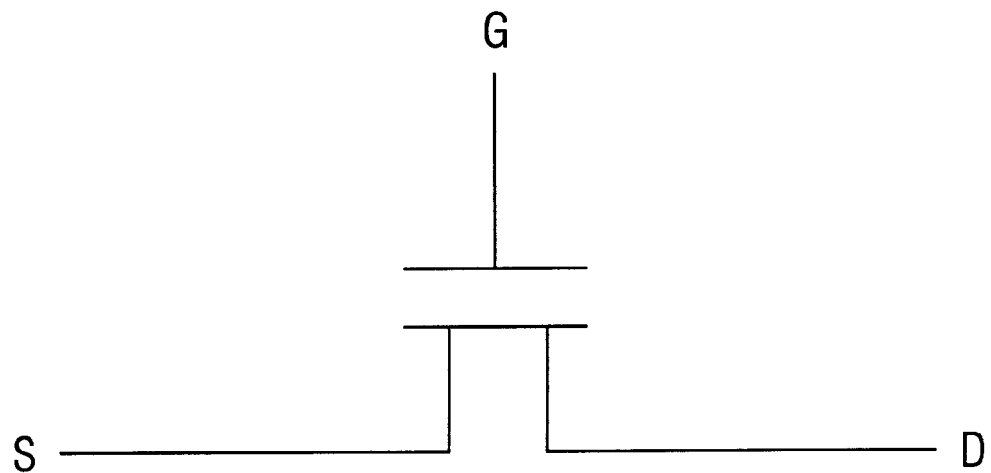
FIGS. 12(A) to 12(B) are views showing manufacturing steps of a conventional thin film transistor.
Figure 12B:
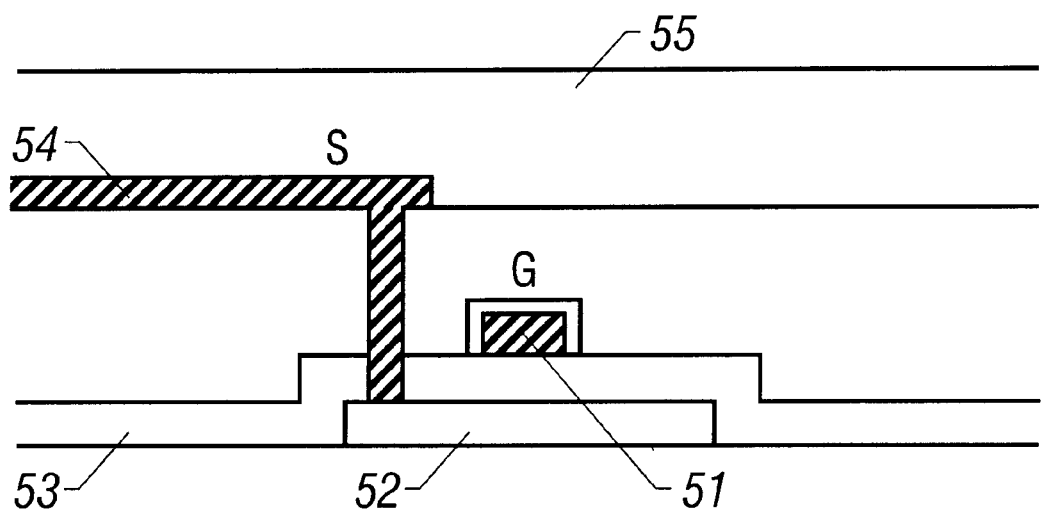

This embodiment is a modification of manufacturing steps shown in FIGS. 1 to 4. The production steps of this embodiment is shown in FIGS. 8 to 11. The features of this embodiment are that after forming openings 931 to 933 (corresponding to the openings 131 to 133 of FIG. 2) formed in the step shown in FIG. 9(C), openings 1031 to 1033 larger than the former openings as shown in FIG. 10(B) are formed. Other production conditions are the same as those of embodiment 1.

[Embodiment 5]

In this embodiment, in the step shown in FIG. 1(B), the dense anodic oxidation films 112, 113 and 114 are not formed. Since there is a fear that defects may occur due to the removal of the dense anodic oxidation films, it is preferable not to use them in the case where the generation of the hillocks or the whiskers can be suppressed.

In this embodiment, in the step shown in FIG. 1(B), the dense anodic oxidation films 112, 113 and 114 are not formed, but a silicon nitride film (not shown) with a thickness of 100 Å to 500 Å is formed after implantation of impurity ions shown in FIG. 1(D).

After the formation of the silicon nitride film, irradiation with laser light is carried out for activation thereof. According to this, the silicon nitride film becomes a barrier to suppress the generation of the hillocks or the whiskers. Thereafter, the first interlayer insulating film may be formed. In this case, the first interlayer insulating film becomes a multi-layer film inevitably.

As described above, according to the present invention, it is possible to prevent the semiconductor device in the course of manufacturing from being broken by a high pulse-like potential given from plasma. Further, it is possible to divide unnecessary wirings without requiring new masks.

What is claimed is:

1. A method of manufacturing a semiconductor device, comprising the steps of:

forming a gate electrode of a thin film transistor and a wiring made of a material which constitutes the gate electrode;

forming a first insulating film covering the gate electrode and the wiring;

forming openings reaching to a source region of the thin film transistor and a part of the wiring in the first insulating film;

forming an electrode in contact with the source region, and a dummy electrode in contact with a part of the wiring;

forming a second insulating film covering said electrode which contacts the source region and the dummy electrode;

forming an opening reaching to a drain region of the thin film transistor and an opening reaching to the dummy electrode in the first insulating film and the second insulating film; and forming an electrode in contact with the drain region and removing the dummy electrode and a part of the wiring.

2. A method of manufacturing a semiconductor device, comprising the steps of:

forming a gate electrode of a thin film transistor and a wiring made of material which constitutes the gate electrode;

forming a first insulating film covering the gate electrode and the wiring;

forming openings reaching to a source region of the thin film transistor and a part of the wiring in the first insulating film;

forming a source electrode in contact with the source region through one of said openings, and a dummy electrode in contact with a part of the wiring through another one of said openings;

forming a second insulating film covering the source electrode and the dummy electrode; and forming a drain electrode in contact with a drain region of the thin film transistor through a hole of said second insulating film and removing the dummy electrode and a part of the wiring.

3. A method of manufacturing a semiconductor device as claimed in claim 1 or 2, wherein the wiring electrically connects the gate electrode of the thin film transistor to the drain region.

4. A method of manufacturing a semiconductor device as claimed in claim 1 or 2, further comprising the steps of forming an anodic oxidation film on an exposed surface of the gate electrode after formation of the gate electrode, wherein the wiring is used to supply an electric current at the anodic oxidation.

5. A method of manufacturing a semiconductor device as claimed in claim 1 or 2, further comprising a step of filling an opening formed by removal of the dummy electrode with a resin material forming a BM (black matrix).

6. A method according to claim 1 wherein said thin film transistor has an LDD structure.

7. A method according to claim 2 wherein said thin film transistor has an LDD structure.

8. A method of manufacturing a semiconductor device, comprising the steps of:

forming a first wiring on the surface of an insulator;

forming a first insulating film on the first wiring;

forming an opening in the first insulating film at a portion where the first wiring is to be divided;

forming a metal portion in the opening which contacts with the first wiring;

forming a second insulating film covering the metal portion;

forming an opening in the second insulating film to expose the metal portion;

forming a conductive film to make an electrode on the second insulating film;

patterning the conductive film at an area where the electrode is to be formed, removing a portion of the conductive to form the electrode; and removing the metal portion and the first wiring under the metal portion when forming the electrode.

9. A method of manufacturing a semiconductor device, comprising the steps of:

forming a gate electrode and a gate wiring, and a wiring from the same material making the gate electrode and the gate wiring;

forming a first insulating film after the former step;

forming an opening in the first insulating film and a metal portion which contacts with the wiring;

forming a second insulating film covering the metal portion;

forming an opening reaching to the metal portion in the second insulating film;

forming a conductive film to make a pixel electrode on the second insulating film;

patterning the conductive film at an area where the pixel electrode is to be formed;

removing a portion of the conductive film to form the pixel electrode; and removing the metal portion through the opening when forming the pixel electrode, and further removing the wiring under the metal portion to divide the wiring.

10. A method of manufacturing an active matrix device comprising the steps of:

forming a first wiring over a substrate, including a gate electrode, a gate wiring and short circuit wiring;

forming a first interlayer insulating film over said first wiring;

forming at least one opening in said first interlayer insulating film to expose a portion of said short circuit wiring;

forming a second wiring on said first interlayer insulating film and in said opening, wherein said second wiring is electrically connected to said gate electrode and said gate wiring through said short circuit wiring;

forming at least one layer over the second wiring by using a plasma process;

patterning a portion of said at least one layer;

removing an unpatterned portion of said at least one layer to expose a portion of said second wiring at said opening;

removing a portion of said second wiring to expose a portion of said short circuit wiring in said opening; and then separating said short circuit wiring by cutting said short circuit wiring at said opening.

11. A method according to claim 10 wherein said at least one layer is an insulating film.

12. A method of manufacturing an active matrix device comprising the steps of:

forming a first wiring over a substrate, including a gate electrode, a gate wiring and a short circuit wiring;

forming a first interlayer insulating film over said first wiring;

forming at least one opening in said first interlayer insulating film to expose a portion of said short circuit wiring;

forming a second wiring on said first interlayer insulating film and in said opening, wherein said second wiring is electrically connected to said gate electrode and said gate wiring through said short circuit wiring;

forming a second interlayer insulating film over the second wiring;

forming an opening in said second interlayer insulating film over said opening of the first interlayer insulating film;

forming a third wiring film on said second interlayer insulating film and in said opening of the second interlayer insulating film;

patterning a portion of the third wiring film;

removing an unpatterned portion of said third wiring film to expose a surface of said second wiring in the opening of the second interlayer insulating film;

removing a portion of the second wiring to expose a surface of the short circuit wiring in the opening of the first interlayer insulating film and subsequently separating said short circuit wiring in the opening of the first interlayer insulating film.

13. A method according to claim 12 wherein said first interlayer insulating film comprises a material selected from the group consisting of silicon oxide, silicon nitride and silicon oxinitride.

14. A method according to claim 12 wherein said second interlayer insulating film comprises a material selected from the group consisting of silicon oxide, silicon nitride and silicon oxinitride.

15. A method of manufacturing an active matrix device comprising the steps of:

forming at least one thin film transistor having a gate electrode and a short circuit wiring wherein said gate electrode and said short circuit wiring are formed from a same conductive film;

forming a first interlayer insulating film over said thin film transistor, said gate electrode, and said short circuit wiring;

forming at least first and second openings in said first interlayer insulating film to expose a portion of said short circuit wiring and a source region of said thin film transistor;

forming a source electrode and a dummy electrode over said first interlayer insulating film wherein said source electrode is in contact with the source region through the first opening and said dummy electrode is in contact with short circuit wiring through the second wiring so that said source electrode is electrically connected to said gate electrode;

forming a second interlayer insulating film over the source electrode and the dummy electrode;

forming a third opening in said second interlayer insulating film to expose a portion of said dummy electrode; and electrically disconnecting said source electrode from said gate electrode by removing a portion of the dummy electrode at said second opening and removing a portion of the short circuit wiring thereunder.

16. A method according to claim 15 wherein said first interlayer insulating film comprises a material selected from the group consisting of silicon oxide, silicon nitride and silicon oxinitride.

17. A method according to claim 15 wherein said second interlayer insulating film comprises a material selected from the group consisting of silicon oxide, silicon nitride and silicon oxinitride.

18. A method according to claim 15 further comprising a step of forming a pixel electrode over said second interlayer insulating film wherein said pixel electrode contacts a drain region of said thin film transistor through a fourth opening in said second interlayer insulating film.

19. A method according to claim 15 wherein said thin film transistor has an LDD structure.

* * * * *